United States Patent
Kang et al.

(10) Patent No.: US 11,244,848 B2
(45) Date of Patent: Feb. 8, 2022

(54) APPARATUS AND METHOD FOR TREATING SUBSTRATE

(71) Applicant: SEMES CO., LTD., Cheonan-si (KR)

(72) Inventors: Hoshin Kang, Asan-si (KR); Dong Yeon Kang, Cheonan-si (KR); Doo Young Oh, Asan-si (KR)

(73) Assignee: SEMES CO., LTD., Chungcheongnam-do (KR)

( * ) Notice: Subject to any disclaimer, the term of this patent is extended or adjusted under 35 U.S.C. 154(b) by 198 days.

(21) Appl. No.: 16/430,692

(22) Filed: Jun. 4, 2019

(65) Prior Publication Data
US 2019/0378750 A1    Dec. 12, 2019

(30) Foreign Application Priority Data

Jun. 7, 2018   (KR) ........................ 10-2018-0065590

(51) Int. Cl.
*H01L 21/677* (2006.01)
*H01L 21/687* (2006.01)
*H01L 21/67* (2006.01)

(52) U.S. Cl.
CPC .... *H01L 21/68707* (2013.01); *H01L 21/6773* (2013.01); *H01L 21/67253* (2013.01); *H01L 21/67772* (2013.01)

(58) Field of Classification Search
None
See application file for complete search history.

(56) References Cited

U.S. PATENT DOCUMENTS

| 5,997,588 A | 12/1999 | Goodwin |
| 6,162,010 A * | 12/2000 | Ishizawa ................. C23C 16/54 414/217 |

(Continued)

FOREIGN PATENT DOCUMENTS

| JP | 2000-208421 A | 7/2000 |
| JP | 3130570 B | 11/2000 |

(Continued)

OTHER PUBLICATIONS

Machine Translation of JP 2001015573 from espacenet. (Year: 2001).*

*Primary Examiner* — Mark C Hageman
(74) *Attorney, Agent, or Firm* — Li & Cai Intellectual Property (USA) Office

(57) ABSTRACT

A method for treating a substrate using a substrate treating apparatus that includes a treating module and an index module that transfers the substrate between a container and the treating module, in which a plurality of process chambers and a main transfer robot are provided in the treating module and a container mounting table and an index robot that transfers the substrate between the container and the treating module are provided in the index module, includes executing a power failure after-treatment operation and thereafter stopping an operation of the substrate treating apparatus when a power failure occurs in the substrate treating apparatus. When the main transfer robot or the index robot is transferring the substrate in the event of the power failure, the power failure after-treatment operation includes an operation of continually maintaining the transfer of the main transfer robot or the index robot until the transfer is completed.

11 Claims, 14 Drawing Sheets

(56) References Cited

U.S. PATENT DOCUMENTS

| | | | | |
|---|---|---|---|---|
| 6,573,482 | B2* | 6/2003 | Mokuo | G05D 23/1909 |
| | | | | 219/481 |
| 6,622,845 | B1* | 9/2003 | Heinrich | B65G 47/50 |
| | | | | 198/349 |
| 6,732,006 | B2* | 5/2004 | Haanstra | H01L 21/67276 |
| | | | | 700/103 |
| 7,506,746 | B2* | 3/2009 | Rice | H01L 21/67724 |
| | | | | 198/346.3 |
| 7,930,061 | B2* | 4/2011 | Rice | H01L 21/67736 |
| | | | | 700/218 |
| 8,210,196 | B2* | 7/2012 | Itafuji | H01L 21/6719 |
| | | | | 137/114 |
| 8,443,513 | B2* | 5/2013 | Ishida | H01L 21/67178 |
| | | | | 29/771 |
| 9,184,071 | B2* | 11/2015 | Ogura | H01L 21/67178 |
| 2009/0028669 | A1* | 1/2009 | Rebstock | B25J 15/0052 |
| | | | | 414/1 |
| 2011/0077767 | A1* | 3/2011 | Chen | H01L 21/67276 |
| | | | | 700/112 |

FOREIGN PATENT DOCUMENTS

| | | |
|---|---|---|
| JP | 2001-015573 A | 1/2001 |
| JP | 5710295 B | 3/2015 |
| KR | 10-2007-0037901 A | 4/2007 |
| KR | 10-2013-0054330 A | 5/2013 |
| KR | 10-1477705 B | 12/2014 |
| KR | 10-1683411 B | 11/2016 |
| KR | 10-1737344 B | 5/2017 |
| KR | 10-2017-0085565 A | 7/2017 |
| KR | 10-2017-0133992 A | 12/2017 |

* cited by examiner

APPARATUS AND METHOD FOR TREATING SUBSTRATE

CROSS-REFERENCE TO RELATED APPLICATIONS

A claim for priority under 35 U.S.C. § 119 is made to Korean Patent Application No. 10-2018-0065590 filed on Jun. 7, 2018, in the Korean Intellectual Property Office, the entire contents of which are hereby incorporated by reference.

BACKGROUND

Embodiments of the inventive concept described herein relate to an apparatus and method for treating a substrate.

To manufacture semiconductor devices, various processes such as photolithography, etching, ashing, ion implantation, thin-film deposition, cleaning and the like are performed to form desired patterns on a substrate. However, in case of a power failure or fire due to unexpected reasons during processing, all apparatuses in a fabrication facility (FAB) stop operating so that substrates in a space at room temperature are damaged. In addition, robots in the progress of a process also stop operating, and hence after-treatment is not easy to perform when the power failure is released later.

SUMMARY

Embodiments of the inventive concept provide a substrate treating apparatus and method for protecting a substrate and facilities by performing after-treatment when an emergency situation occurs.

Embodiments of the inventive concept provide a substrate treating apparatus and method for easily performing after-treatment when an emergency situation is recovered, by performing after-treatment when the emergency situation occurs.

According to an exemplary embodiment, a method for treating a substrate using a substrate treating apparatus that includes a treating module that treats the substrate and an index module that is disposed adjacent to the treating module and that transfers the substrate between a container in which the substrate is received and the treating module includes executing a power failure after-treatment operation and thereafter stopping an operation of the substrate treating apparatus when a power failure occurs in the substrate treating apparatus.

A plurality of process chambers that treat the substrate and a main transfer robot that transfers the substrate between the plurality of process chambers are provided in the treating module, and a container mounting table on which the container is placed and an index robot that transfers the substrate between the container and the treating module are provided in the index module.

When the main transfer robot or the index robot is transferring the substrate in the event of the power failure, the power failure after-treatment operation may include an operation of continually maintaining the transfer of the main transfer robot or the index robot until the transfer is completed.

The transfer of the main transfer robot or the index robot may be allowed to complete a predetermined transfer cycle.

The main transfer robot or the index robot may be moved to a safety position after the transfer is completed.

In the inventive concept, the power failure after-treatment operation may include an operation of closing a door of the container placed on the container mounting table, when the door is open in the event of the power failure.

The power failure after-treatment operation may include an operation of maintaining power of a controller during standby time in the event of the power failure and interrupting the power of the controller when the power failure is maintained until the standby time passes.

In the substrate treating method, whether the power failure occurs or not may be determined by using a power failure detection sensor.

According to an exemplary embodiment, an apparatus for treating a substrate includes a treating module having a plurality of process chambers, a cassette container in which the substrate to be subjected to a process is stored, an index module that transfers the substrate between the cassette container and the treating module, a main controller that performs overall control of the process, a robot controller that controls an index robot that transfers the substrate between the cassette container and the treating module and a main transfer robot that transfers the substrate between the plurality of process chambers of the treating module, a chamber controller that controls the process chambers in the treating module, and an emergency unit that controls an after-treatment operation to be performed when an emergency situation occurs.

The emergency unit may include a power failure detection sensor.

The emergency unit may control the robot controller to stop the index robot or the main transfer robot after completion of a transfer cycle of the index robot or the main transfer robot when the power failure detection sensor senses the power failure.

The emergency unit may perform control to close a door of the cassette container when the door of the cassette container is open at the time of sensing the power failure by the power failure detection sensor.

The emergency unit may control the chamber controller to close a valve in a liquid treating chamber of the treating module when the power failure detection sensor senses the power failure.

The emergency unit may control the chamber controller to move the substrate on a heating unit in a heat treatment chamber of the treating module to a cooling unit when the power failure detection sensor senses the power failure.

The emergency unit may perform control to maintain power of the main controller during standby time in the event of the power failure and interrupt the power of the main controller when the power failure is maintained until the standby time passes.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
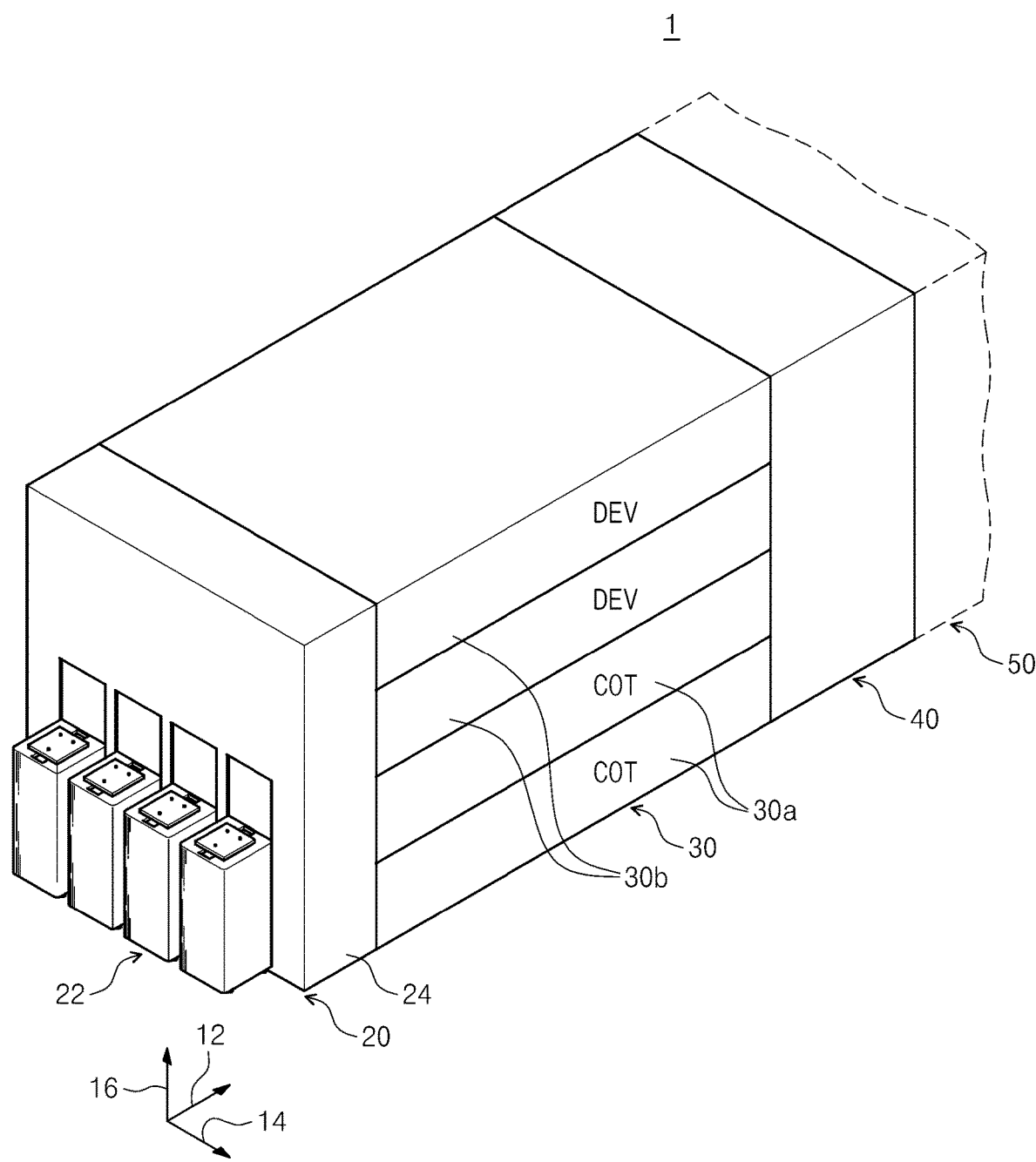
FIG. 1 is a schematic perspective view illustrating a substrate treating apparatus according to an embodiment of the inventive concept.

Hereinafter, embodiments of the inventive concept will be described in detail with reference to the accompanying drawings such that those skilled in the art to which the inventive concept pertains can readily carry out the inventive concept. However, the inventive concept may be implemented in various different forms and is not limited to the embodiments described herein. Furthermore, in describing the embodiments of the inventive concept, detailed descriptions related to well-known functions or configurations will be omitted when they may make subject matters of the inventive concept unnecessarily obscure. In addition, components performing similar functions and operations are provided with identical reference numerals throughout the accompanying drawings.

The terms "include" and "comprise" in the specification are "open type" expressions just to say that the corresponding components exist and, unless specifically described to the contrary, do not exclude but may include additional components. Specifically, it should be understood that the terms "include", "comprise", and "have", when used herein, specify the presence of stated features, integers, steps, operations, components, and/or parts, but do not preclude the presence or addition of one or more other features, integers, steps, operations, components, parts, and/or groups thereof.

The terms such as first, second, and the like may be used to describe various components, but the components should not be limited by the terms. The terms may be used only for distinguishing one component from others. For example, without departing the scope of the inventive concept, a first component may be referred to as a second component, and similarly, the second component may also be referred to as the first component.

The terms of a singular form may include plural forms unless otherwise specified. Furthermore, in the drawings, the shapes and dimensions of components may be exaggerated for clarity of illustration.

In the entire specification, the terminology, component "~unit," refers to a software component or a hardware component such as an FPGA or an ASIC, and performs at least one function or operation. It should be, however, understood that the component "~unit" is not limited to a software or hardware component. The component "~unit" may be implemented in storage media that can be designated by addresses. The component "~unit" may also be configured to regenerate one or more processors.

For example, the component "~unit" may include various types of components (e.g., software components, object-oriented software components, class components, and task components), processes, functions, attributes, procedures, sub-routines, segments of program codes, drivers, firmware, micro-codes, circuit, data, data base, data structures, tables, arrays, and variables. Functions provided by a component and the component "~unit" may be separately performed by a plurality of components and components "~units" and may also be integrated with other additional components.

Figure 2:
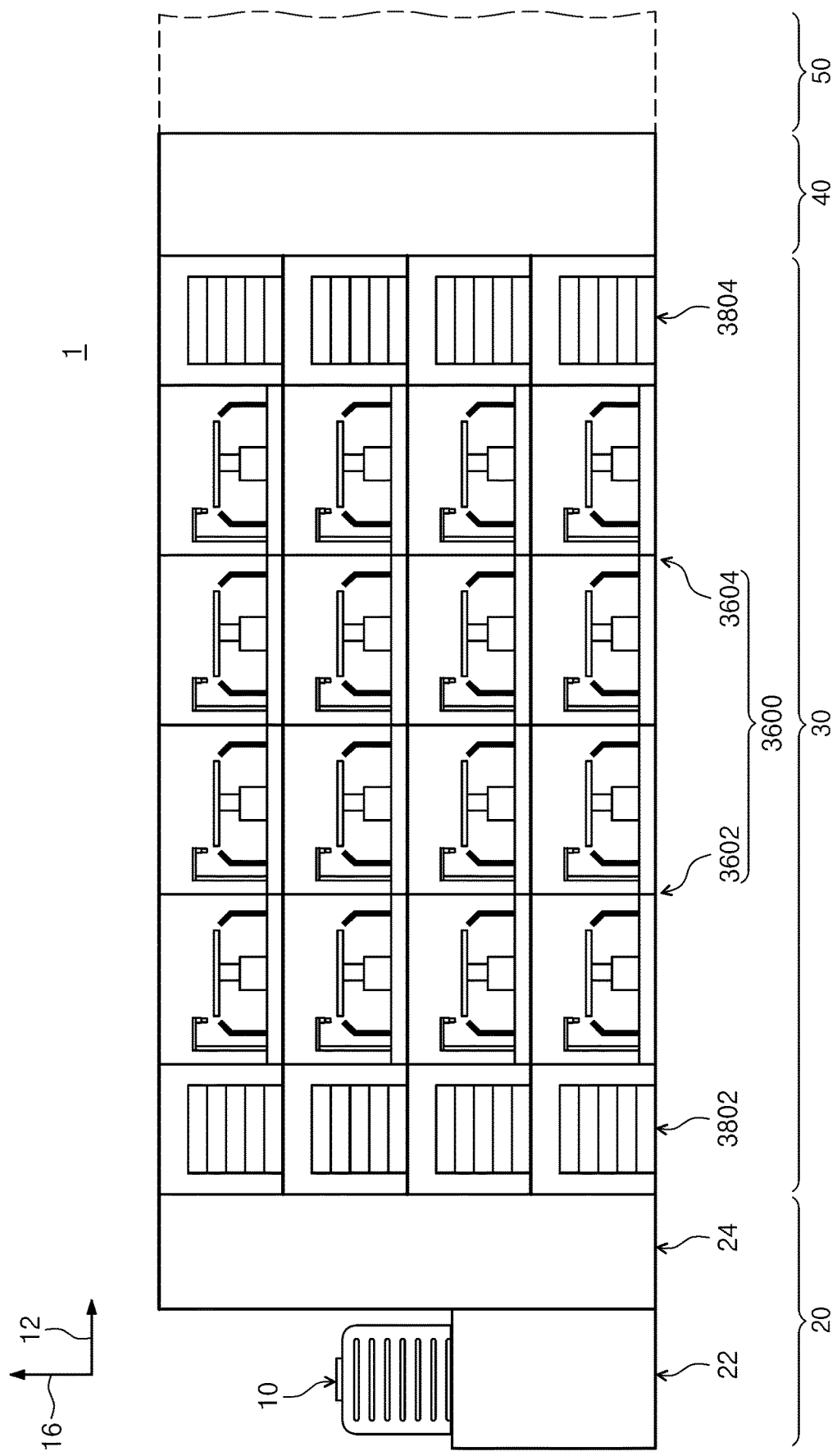
FIG. 2 is a sectional view of the substrate treating apparatus illustrating a coating block or a developing block of FIG. 1.
Figure 3:
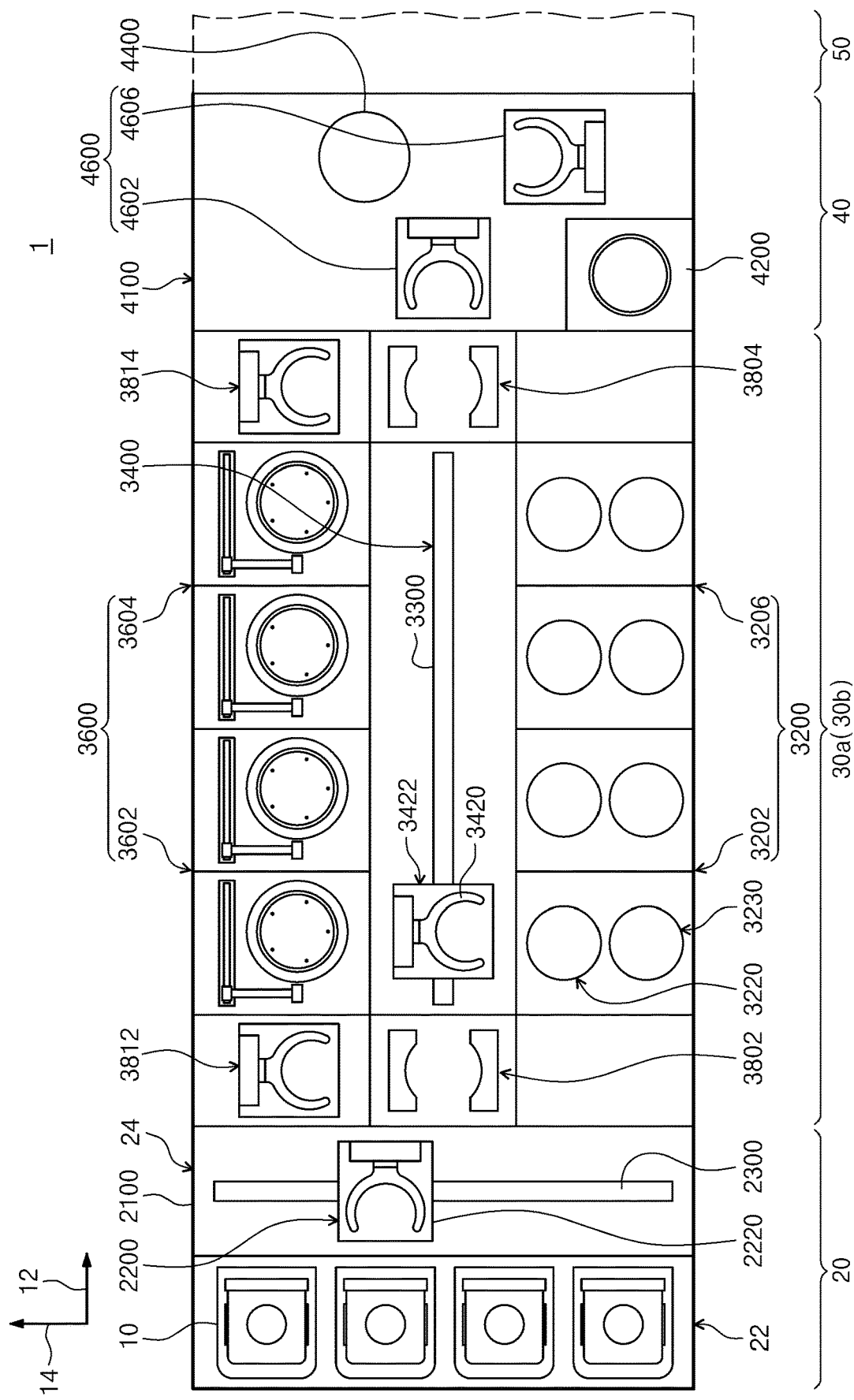
FIG. 3 is a plan view illustrating the substrate treating apparatus of FIG. 1.

FIG. 1 is a schematic perspective view illustrating a substrate treating apparatus according to an embodiment of the inventive concept. FIG. 2 is a sectional view of the substrate treating apparatus illustrating a coating block or a developing block of FIG. 1. FIG. 3 is a plan view illustrating the substrate treating apparatus of FIG. 1.

Referring to FIGS. 1 to 3, the substrate treating apparatus 1 includes an index module 20, a treating module 30, and an interface module 40. According to an embodiment, the index module 20, the treating module 30, and the interface module 40 are sequentially arranged in a row. Hereinafter, the direction in which the index module 20, the treating module 30, and the interface module 40 are arranged is referred to as a first direction 12, a direction perpendicular to the first direction 12 when viewed from above is referred to as a second direction 14, and a direction perpendicular to both the first direction 12 and the second direction 14 is referred to as a third direction 16.

The index module 20 transfers substrates W received in containers 10 to the treating module 30 and places processed substrates W in the containers 10. The long side of the index module 20 is oriented in the second direction 14. The index module 20 has load ports 22 and an index frame 24. The load ports 22 are located on the opposite side to the treating module 30 with respect to the index frame 24. The containers 10 having the substrates W received therein are placed on the load ports 22. The plurality of load ports 22 may be arranged along the second direction 14.

Airtight containers 10 such as front open unified pods (FOUPs) may be used as the containers 10. The containers 10 may be placed on the load ports 22 by a transfer device (not illustrated) such as an overhead transfer, an overhead conveyor, or an automatic guided vehicle, or by a worker.

The index frame 24 has an index robot 2200 inside. A guide rail 2300, the long side of which is oriented in the second direction 14, is provided in the index frame 24. The index robot 2200 is movable on the guide rail 2300. The index robot 2200 includes a hand 2220 on which a substrate W is placed, and the hand 2220 is movable forward and backward, rotatable about an axis oriented in the third direction 16, and movable along the third direction 16.

The treating module 30 performs a coating process and a developing process on a substrate W. The treating module 30 has coating blocks 30a and developing blocks 30b. Each of the coating blocks 30a performs a coating process on a substrate W, and each of the developing blocks 30b performs a developing process on the substrate W. The plurality of coating blocks 30a are stacked on each other. The plurality of developing blocks 30b are stacked on each other. According to the embodiment of FIG. 1, two coating blocks 30a and two developing block 30b are provided. The coating blocks 30a may be disposed under the developing blocks 30b. According to an embodiment, the two coating blocks 30a may perform the same process and may have the same structure. Furthermore, the two developing blocks 30b may perform the same process and may have the same structure.

Referring to FIGS. 2 and 3, each of the coating blocks 30a has heat treatment chambers 3200, a transfer chamber 3400, liquid treating chambers 3600, and buffer chambers 3800. The heat treatment chambers 3200 perform a heat treatment process on a substrates W. The heat treatment process may include a cooling process and a heating process. The liquid treating chambers 3600 form a liquid film on a substrate W by dispensing a liquid onto the substrate W. The liquid film may be a photoresist film or an anti-reflection film. The transfer chamber 3400 transfers a substrate W between the heat treatment chambers 3200 and the liquid treating chambers 3600 in the coating block 30a.

The long side of the transfer chamber 3400 is parallel to the first direction 12. The transfer chamber 3400 has a main transfer robot 3422 inside. The main transfer robot 3422 transfers a substrate W between the heat treatment chambers 3200, the liquid treating chambers 3600, and the buffer chambers 3800. According to an embodiment, the main transfer robot 3422 has a hand 3420 on which a substrate W is placed, and the hand 3420 is movable forward and backward, rotatable about an axis oriented in the third direction 16, and movable along the third direction 16. A guide rail 3300, the longitudinal direction of which is parallel to the first direction 12, is provided in the transfer chamber 3400, and the main transfer robot 3422 is movable on the guide rail 3300.

The plurality of heat treatment chambers 3200 are arranged along the first direction 12. The heat treatment chambers 3200 may be located on one side of the transfer chamber 3400.

Figure 4:
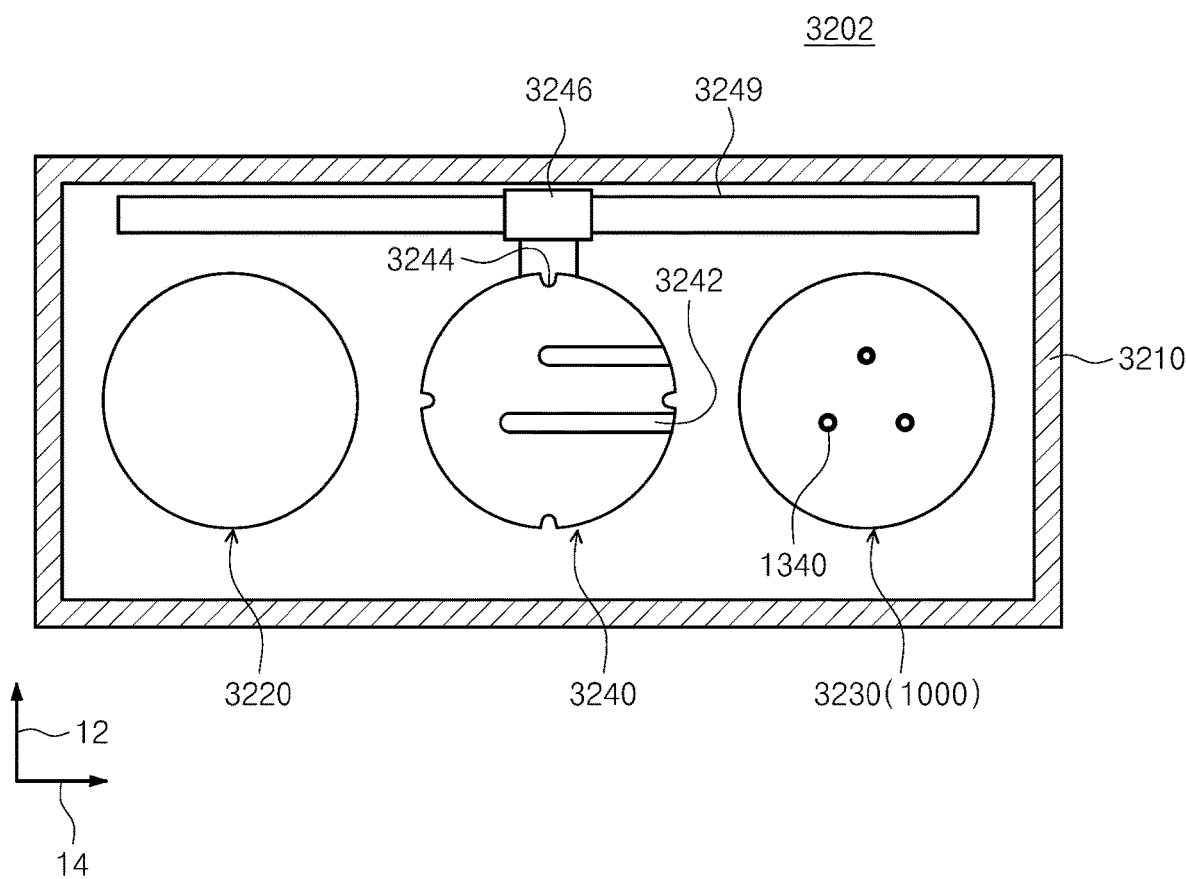
FIG. 4 is a schematic plan view illustrating an example of heat treatment chambers of FIG. 3.
Figure 5:
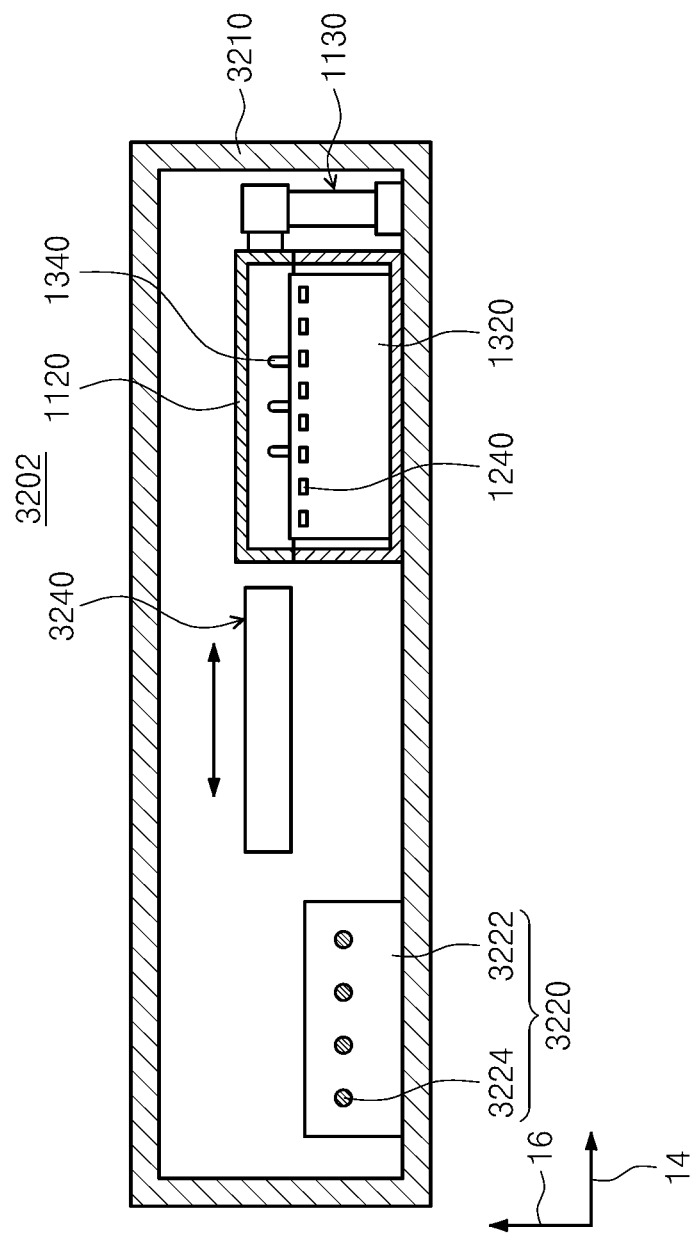
FIG. 5 is a front view illustrating the heat treatment chamber of FIG. 4.

FIG. 4 is a schematic plan view illustrating an example of the heat treatment chambers of FIG. 3, and FIG. 5 is a front view of the heat treatment chamber of FIG. 4. The heat treatment chamber 3200 has a housing 3210, a cooling unit 3220, a heating unit 3230, and a transfer plate 3240.

The housing 3210 has a substantially rectangular parallelepiped shape. The housing 3210 has an entrance (not illustrated) formed in a sidewall thereof, through which a substrate W is loaded into or unloaded from the housing 3210. The entrance may remain open. Alternatively, a door (not illustrated) for opening or closing the entrance may be provided. The cooling unit 3220, the heating unit 3230, and the transfer plate 3240 are provided in the housing 3210. The cooling unit 3220 and the heating unit 3230 are provided side by side along the second direction 14. According to an embodiment, the cooling unit 3220 may be located closer to the transfer chamber 3400 than the heating unit 3230.

The cooling unit 3220 has a cooling plate 3222. The cooling plate 3222 may have a substantially circular shape when viewed from above. The cooling plate 3222 has a cooling member 3224 therein. According to an embodiment, the cooling member 3224 may be formed in the cooling plate 3222 and may serve as a passage through which a cooling fluid flows.

The heating unit 3230 is provided as an apparatus 1000 that heats a substrate W to a temperature higher than the room temperature. The heating unit 3230 performs heat treatment on the substrate W in the atmospheric atmosphere or in an atmosphere of reduced pressure lower than the atmospheric pressure.

The plurality of liquid treating chambers 3600 are provided. Some of the liquid treating chambers 3600 may be stacked on each other. The liquid treating chambers 3600 are located on one side of the transfer chamber 3400. The liquid treating chambers 3600 are arranged side by side along the first direction 12. Some of the liquid treating chambers 3600 are located adjacent to the index module 20. Hereinafter, these liquid treating chambers are referred to as front liquid treating chambers 3602. Other liquid treating chambers 3600 are located adjacent to the interface module 40. Hereinafter, these liquid treating chambers are referred to as rear liquid treating chambers 3604.

The front liquid treating chambers 3602 apply a first liquid to a substrate W, and the rear liquid treating chambers 3604 apply a second liquid to the substrate W. The first liquid and the second liquid may be different types of liquids. According to an embodiment, the first liquid is an anti-reflection film, and the second liquid is photoresist. The photoresist may be applied to the substrate W coated with the anti-reflection film. Alternatively, the first liquid may be photoresist, and the second liquid may be an anti-reflection film. In this case, the anti-reflection film may be applied to the substrate W coated with the photoresist. In another case, the first liquid and the second liquid may be of the same type. Both the first liquid and the second liquid may be photoresist.

Figure 6:
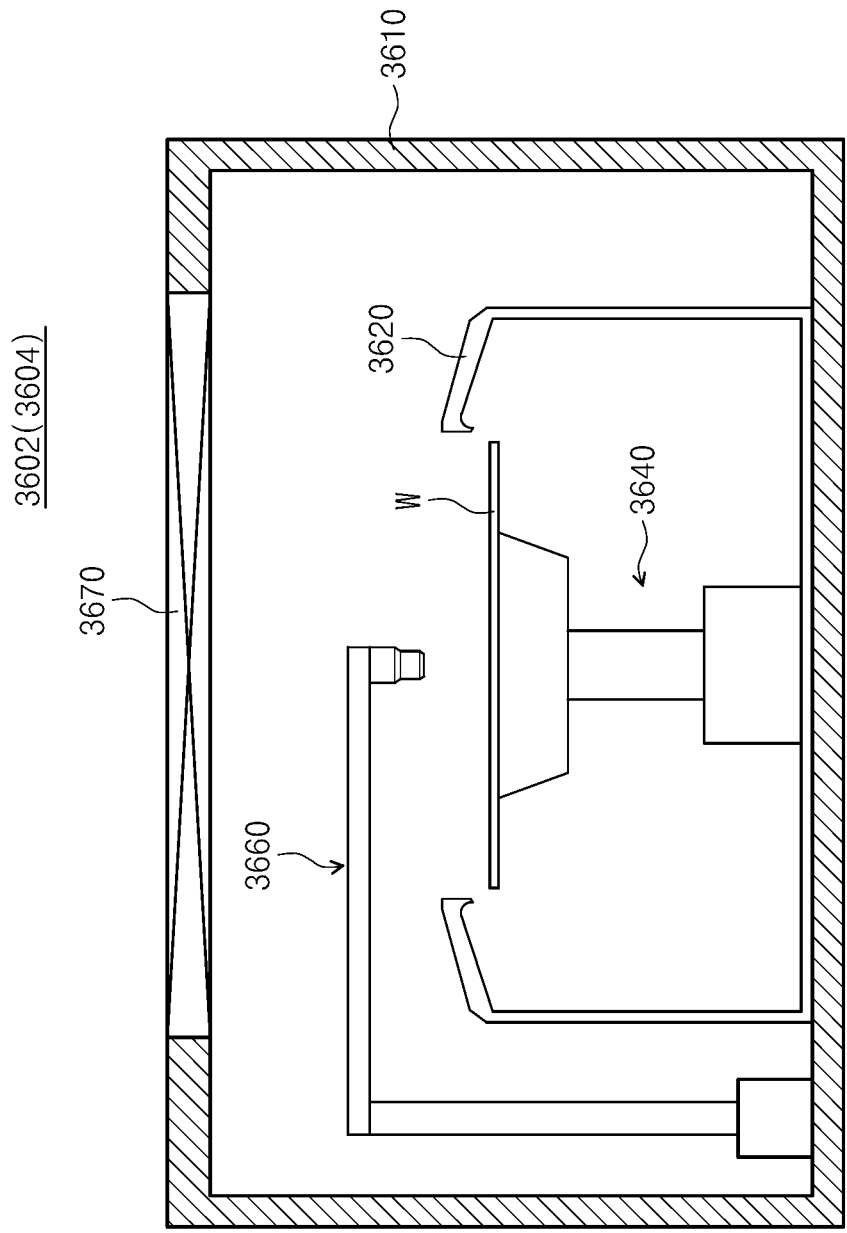
FIG. 6 is a schematic view illustrating an example of liquid treating chambers of FIG. 3.

FIG. 6 is a schematic view illustrating an example of the liquid treating chambers of FIG. 3. Referring to FIG. 6, the liquid treating chambers 3602 and 3604 have a housing 3610, a cup 3620, a support unit 3640, and a liquid dispensing unit 3660. The housing 3610 has a substantially rectangular parallelepiped shape. The housing 3610 has an entrance (not illustrated) formed in a sidewall thereof, through which a substrate W is placed in or extracted from the housing 3610. The entrance may be opened or closed by a door (not illustrated). The cup 3620, the support unit 3640, and the liquid dispensing unit 3660 are provided in the housing 3610. A fan filter unit 3670 for forming a downward flow of air in the housing 3610 may be provided in an upper wall of the housing 3610. The cup 3620 has a treating space that is open at the top. The support unit 3640 is disposed in the treating space and supports a substrate W. The support unit 3640 is provided such that the substrate W is rotatable during liquid treating. The liquid dispensing unit 3660 dispenses a liquid onto the substrate W supported on the support unit 3640.

Referring to again FIG. 2, the plurality of buffer chambers 3800 are provided. Some of the buffer chambers 3800 are disposed between the index module 20 and the transfer chamber 3400. Hereinafter, these buffer chambers are referred to as front buffers 3802. The plurality of front buffers 3802 are stacked on each other along the vertical direction. The other buffer chambers 3800 are disposed between the transfer chamber 3400 and the interface module 40. Hereinafter, these buffer chambers are referred to as rear buffers 3804. The plurality of rear buffers 3804 are stacked on each other along the vertical direction. The front buffers 3802 and the rear buffers 3804 each temporarily store a plurality of substrates W. The substrates W stored in the front buffers 3802 are placed or extracted by the index robot 2200 and the main transfer robot 3422. The substrates W stored in the rear buffers 3804 are placed or extracted by the transfer robot 3422 and a first robot 4602.

Each of the developing blocks 30b has heat treatment chambers 3200, a transfer chamber 3400, and liquid treating chambers 3600. The heat treatment chambers 3200, the transfer chamber 3400, and the liquid treating chambers 3600 of the developing block 30b are provided in a structure and an arrangement similar to the structure and the arrangement of the heat treatment chambers 3200, the transfer chamber 3400, and the liquid treating chambers 3600 of the coating block 30a. So that they correspond to each other. However, the liquid treating chambers 3600 in the developing block 30b are provided as developing chambers 3600, all of which identically dispense a developing solution to develop a substrate.

The interface module 40 connects the treating module 30 to an external stepper 50. The interface module 40 has an interface frame 4100, additional process chambers 4200, interface buffers 4400, and a transfer member 4600.

The interface frame 4100 may have a fan filter unit at the top thereof, which forms a downward flow of air in the interface frame 4100. The additional process chambers 4200, the interface buffers 4400, and the transfer member 4600 are disposed in the interface frame 4100. The additional process chambers 4200 may perform a predetermined additional process on a substrate W processed in the coating block 30*a* before the substrate W is transferred to the stepper 50. Alternatively, the additional process chambers 4200 may perform a predetermined additional process on a substrate W processed in the stepper 50 before the substrate W is transferred to the developing block 30*b*. According to an embodiment, the additional process may be an edge exposing process of exposing the edge region of the substrate W to light, a top-side cleaning process of cleaning the top side of the substrate W, or a back-side cleaning process of cleaning the back side of the substrate W. The plurality of additional process chambers 4200 may be stacked on each other. The additional process chambers 4200 may all perform the same process. Alternatively, some of the additional process chambers 4200 may perform different processes.

The interface buffers 4400 provide a space in which substrates W transferred between the coating blocks 30*a*, the additional process chambers 4200, the stepper 50, and the developing blocks 30*b* temporarily stay. The plurality of interface buffers 4400 may be stacked on each other.

According to an embodiment, the additional process chambers 4200 may be disposed on one side of an extension line oriented in the longitudinal direction of the transfer chamber 3400, and the interface buffers 4400 may be disposed on the other side of the extension line.

The transfer member 4600 transfers substrates W between the coating blocks 30*a*, the additional process chambers 4200, the stepper 50, and the developing blocks 30*b*. The transfer member 4600 may be implemented with one or more robots. According to an embodiment, the transfer member 4600 has the first robot 4602 and a second robot 4606. The first robot 4602 may transfer substrates W between the coating blocks 30*a*, the additional process chambers 4200, and the interface buffers 4400. The second robot 4606 may transfer substrates W between the interface buffers 4400 and the stepper 50. The second robot 4606 may transfer substrates W between the interface buffers 4400 and the developing blocks 30*b*.

According to an embodiment, the index robot 2200 may directly exchange substrates W with the heating units 3230 of the front heat treatment chambers 3200 provided in the coating blocks 30*a*.

Furthermore, the main transfer robots 3422 provided in the coating blocks 30*a* and the developing blocks 30*b* may directly exchange substrates W with the transfer plates 3240 located in the heat treatment chambers 3200.

Hereinafter, an embodiment of a transfer path of a substrate W from the container 10 to the stepper 50 will be described.

The index robot 2200 extracts the substrate W from the container 10 and transfers the substrate W to the front buffer 3802. The main transfer robot 3422 transfers the substrate W stored in the front buffer 3802 to the front heat treatment chamber 3200. The substrate W is transferred to the heating unit 3230 by the transfer plate 3240. When a heating process is completely performed on the substrate W in the heating unit 3230, the transfer plate 3240 transfers the substrate W to the cooling unit 3220. The transfer plate 3240 is brought into contact with the cooling unit 3220 and performs a cooling process on the substrate W supported on the transfer plate 3240. When the cooling process is completed, the transfer plate 3240 moves above the cooling unit 3220, and the main transfer robot 3422 extracts the substrate W from the heat treatment chamber 3200 and transfers the substrate W to the front liquid treating chamber 3602.

The front liquid treating chamber 3602 coats the substrate W with an anti-reflection film.

The main transfer robot 3422 extracts the substrate W from the front liquid treating chamber 3602 and places the substrate W in the heat treatment chamber 3200. The heat treatment chamber 3200 sequentially performs the above-described heating and cooling processes. When each heat treatment process is completed, the main transfer robot 3422 extracts the substrate W from the heat treatment chamber 3200 and places the substrate W in the rear liquid treating chamber 3604.

Thereafter, the rear liquid treating chamber 3604 coats the substrate W with a photoresist film.

The main transfer robot 3422 extracts the substrate W from the rear liquid treating chamber 3604 and places the substrate W in the heat treatment chamber 3200. The heat treatment chamber 3200 sequentially performs the above-described heating and cooling processes. When the heat treatment processes are completed, the main transfer robot 3422 transfers the substrate W to the rear buffer 3804. The first robot 4602 of the interface module 40 extracts the substrate W from the rear buffer 3804 and transfers the substrate W to the additional process chamber 4200.

The additional process chamber 4200 performs an edge exposing process on the substrate W.

The first robot 4602 extracts the substrate W from the additional process chamber 4200 and transfers the substrate W to the interface buffer 4400.

The second robot 4606 extracts the substrate W from the interface buffer 4400 and transfers the substrate W to the stepper 50.

Hereinafter, an example of a transfer path of the substrate W from the stepper 50 to the container 10 will be described.

The second robot 4606 extracts the substrate W from the stepper 50 and transfers the substrate W to the interface buffer 4400.

The first robot 4602 extracts the substrate W from the interface buffer 4400 and transfers the substrate W to the rear buffer 3804. The main transfer robot 3422 extracts the substrate W from the rear buffer 3804 and transfers the substrate W to the heat treatment chamber 3200. The heat treatment chamber 3200 sequentially performs a heating process and a cooling process on the substrate W. When the cooling process is completed, the substrate W is transferred to the developing chamber 3600 by the main transfer robot 3422.

The developing chamber 3600 performs a developing process by dispensing a developing solution onto the substrate W.

The substrate W is extracted from the developing chamber 3600 and placed in the heat treatment chamber 3200 by the main transfer robot 3422. The heat treatment chamber 3200 sequentially performs a heating process and a cooling process on the substrate W. When the cooling process is completed, the substrate W is extracted from the heat treatment chamber 3200 and transferred to the front buffer 3802 by the main transfer robot 3422.

The index robot 2200 extracts the substrate W from the front buffer 3802 and transfers the substrate W to the container 10.

The treating module 30 of the substrate treating apparatus 1 have been described as performing the coating process and the developing process. However, the substrate treating apparatus 1 may include only the index module 20 and the treating module 30 without the interface module 40. In this case, the treating module 30 may perform only the coating process, and a film with which a substrate W is coated may be a spin-on hardmask (SOH) film.

Hereinafter, an after-treatment method in the event of a power failure will be specifically described, based on the contents of the substrate treating process.

Figure 7:
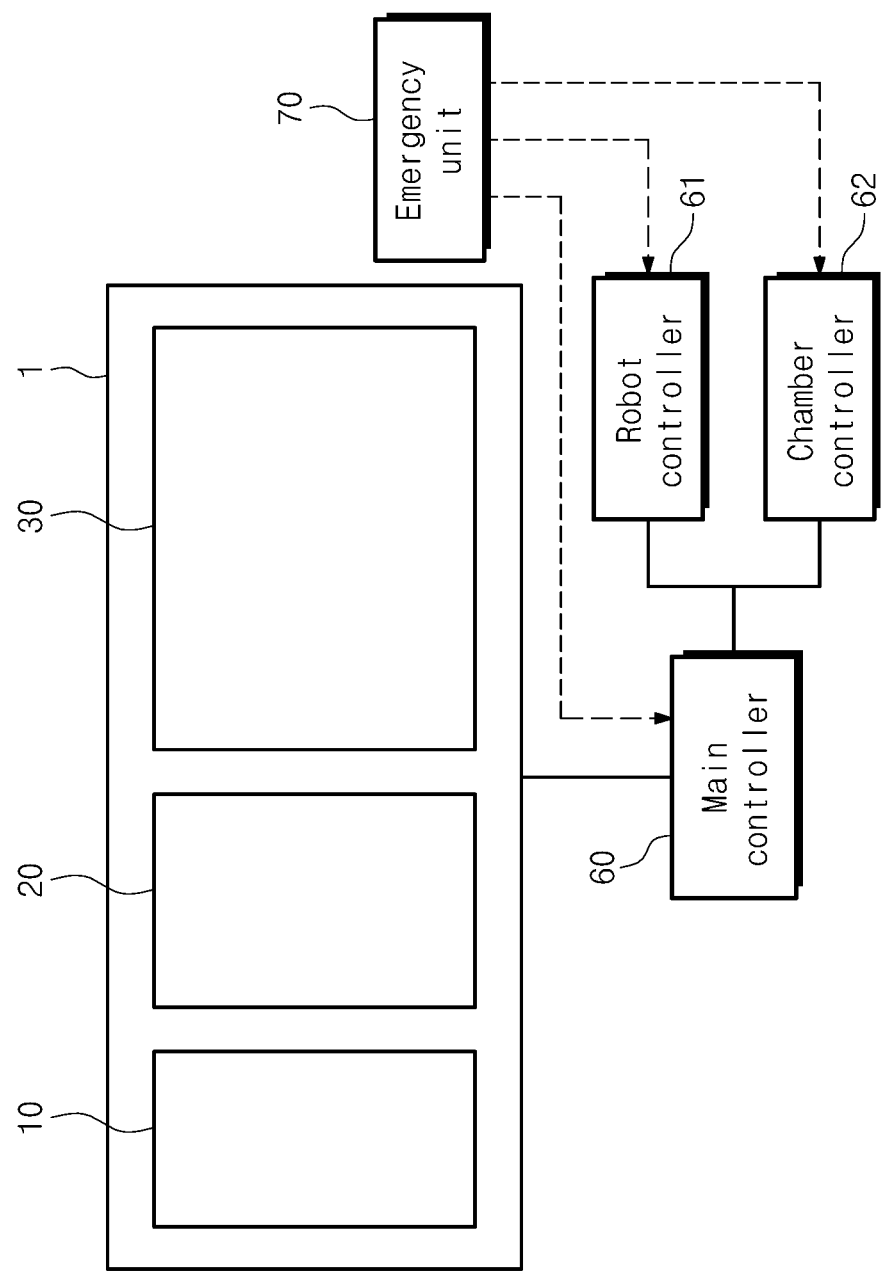
FIG. 7 is a schematic view illustrating a configuration of the substrate treating apparatus of the inventive concept.

FIG. 7 is a schematic view illustrating the substrate treating apparatus 1 according to the inventive concept in a block form. The substrate treating apparatus 1 according to the inventive concept includes the cassette container 10, the index module 20, and the treating module 30 and may include a main controller 60 that performs overall control of a process, a robot controller 61 that controls the movement of the index robot 2200 included in the index module 20 and the main transfer robot 3422 included in the treating module 30, a chamber controller 62 that controls operations of the chambers in the treating module 30, and an emergency unit 70 that performs control to perform an after-treatment operation in the event of an emergency. When a power failure occurs in the substrate treating apparatus 1 according to the inventive concept, the emergency unit 70 of the substrate treating apparatus 1 performs a power failure after-treatment operation. The emergency unit 70 may include a power failure detection sensor (not illustrated). The emergency unit 70 may determine whether a power failure occurs or not, by using the power failure detection sensor. Alternatively, the emergency unit 70 may determine whether a power failure occurs or not, by recognizing an external situation through an I/O module. When a power failure is detected, the emergency unit 70 controls the robot controller 61 to stop the index robot 2200 included in the index module 20 and the main transfer robot 3422 included in the treating module 30 after completion of transfer cycles of the index robot 2200 and the main transfer robot 3422. First, the emergency unit 70 determines whether the index robot 2200 and the main transfer robot 3422 are in operation. In the case where the robots 2200 and 3422 are in operation, the emergency unit 70 determines where the robots 2200 and 3422 are located during the transfer cycles. In the case where the robots 2200 and 3422 are present in an intermediate process of the transfer cycles rather than at start points thereof, the emergency unit 70 controls the robot controller 61 to stop the robots 2200 and 3422 after completion of the corresponding transfer cycles.

Figure 8:
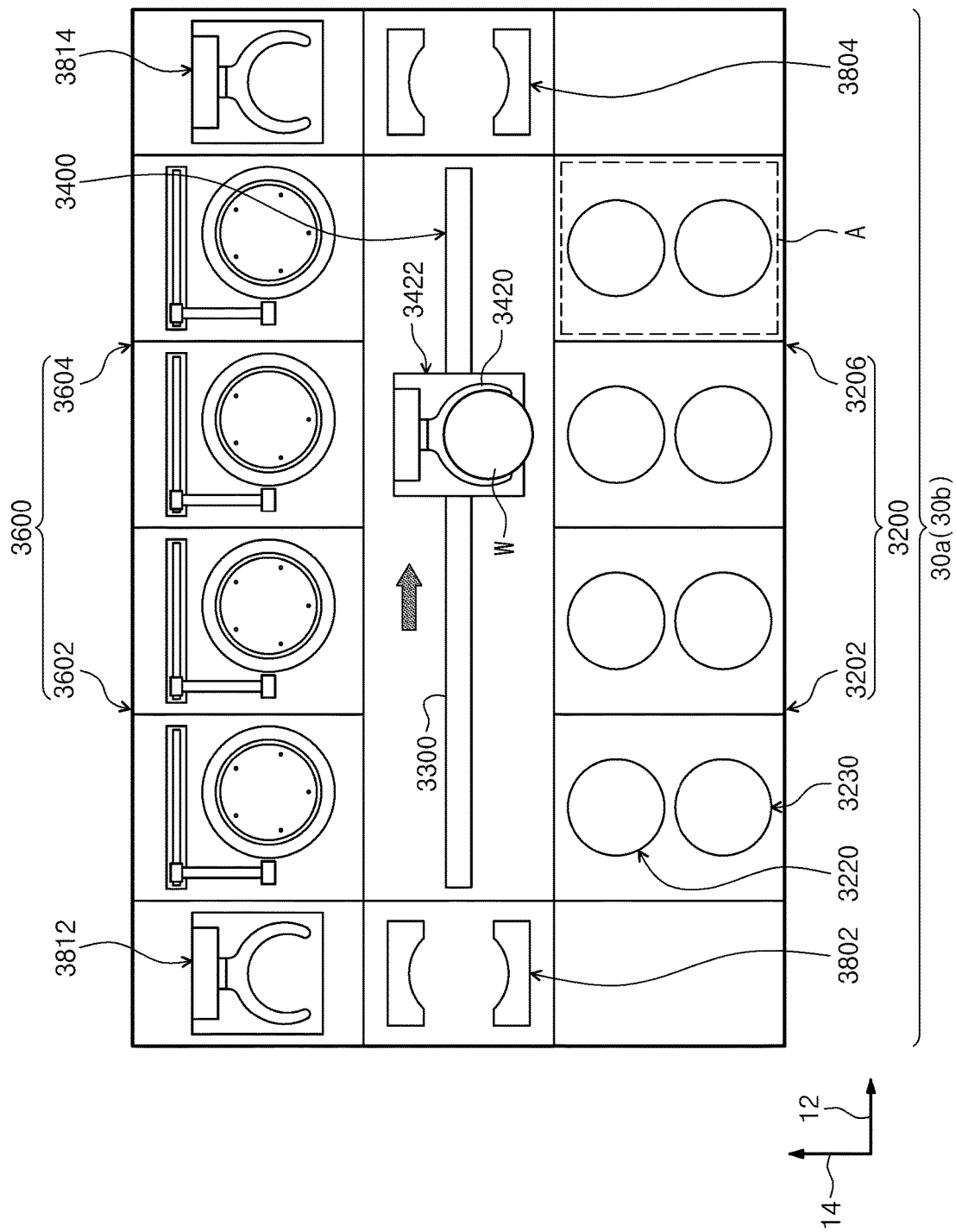
FIGS. 8 to 12 are views sequentially illustrating a robot control method in the event of a power failure according to the inventive concept.
Figure 9:
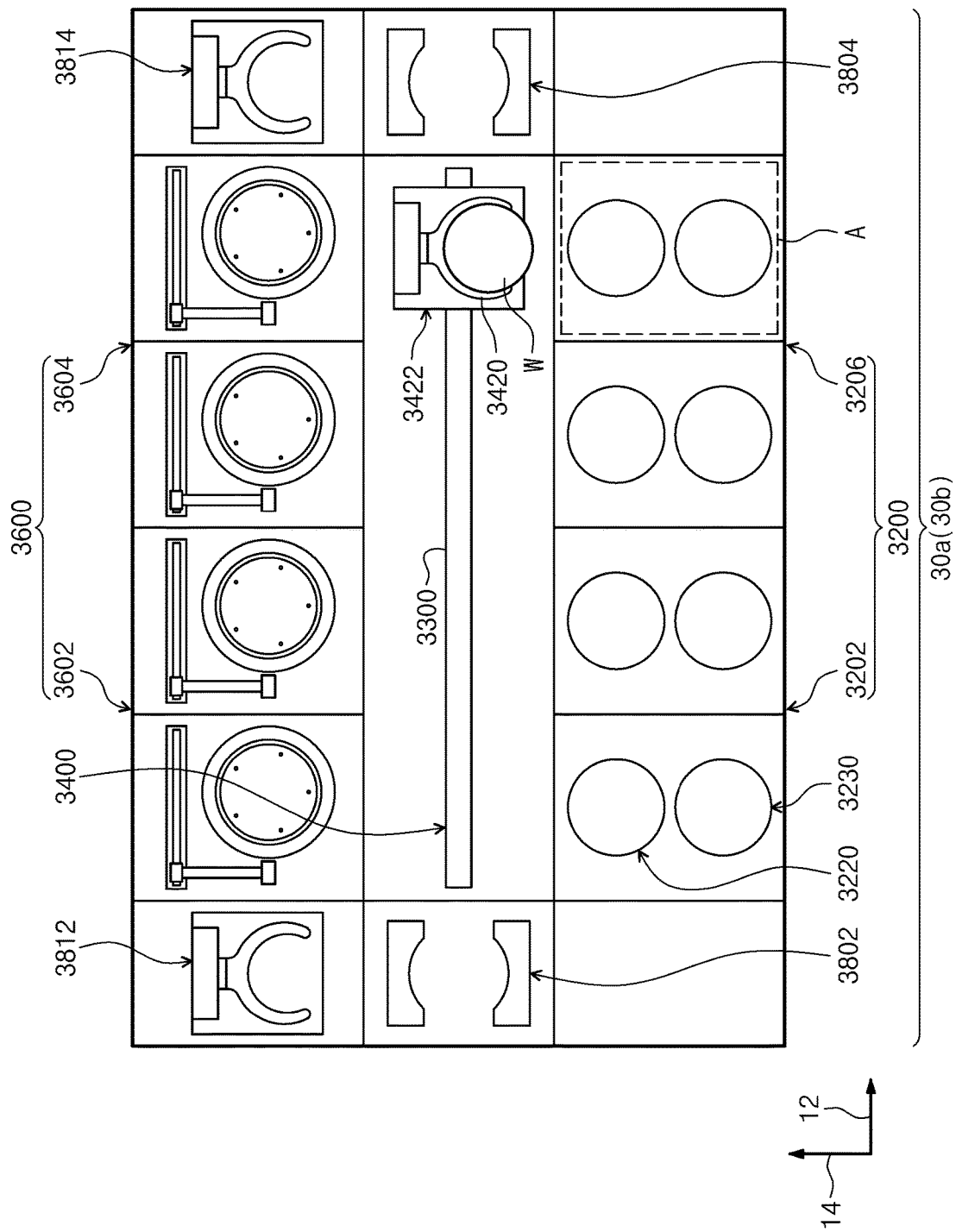
Figure 10:
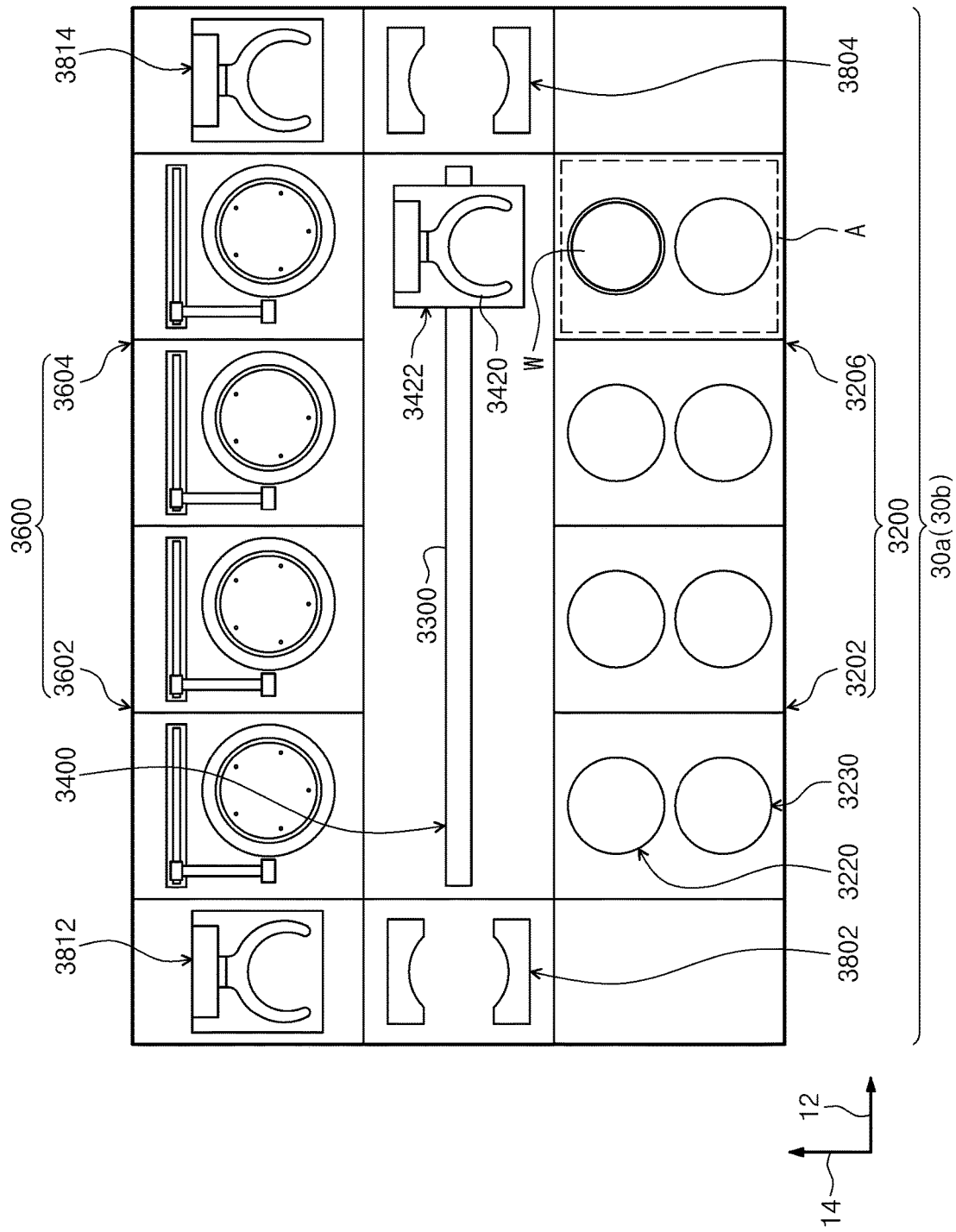
Figure 11:
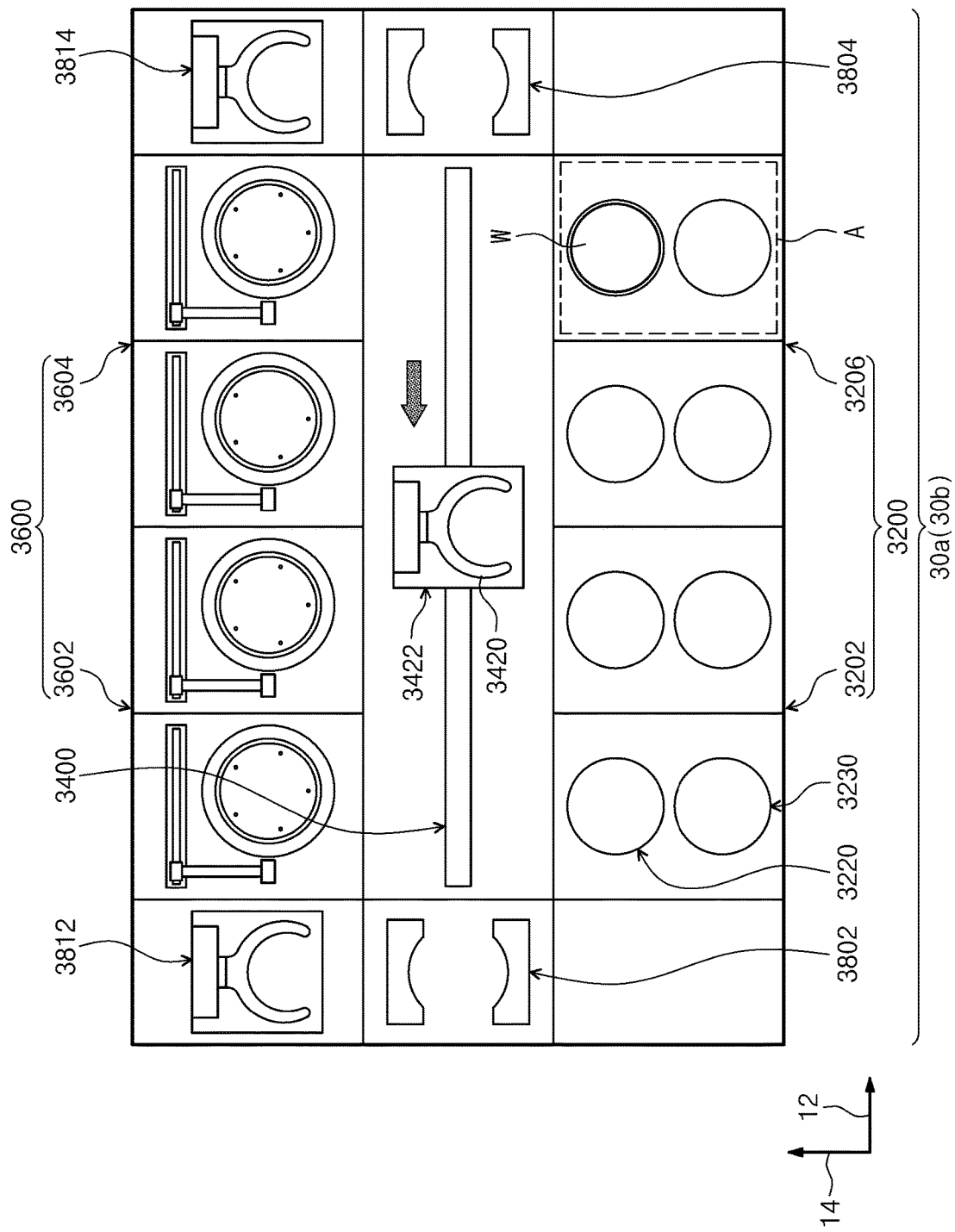

A method of controlling a robot by the robot controller 61 will be described with reference to FIGS. 8 to 12. Referring to FIG. 8, it is assumed that a power failure occurs while the main transfer robot 3422 of the substrate treating apparatus 1 transports a substrate W to chamber A among the heat treatment chambers 3200. In the related art, because the main transfer robot 3422 stops at its position when the power failure occurs, the corresponding substrate W continues to stand by on the main transfer robot 3422 even though the next treatment has to be performed on the corresponding substrate W. Hence, there may be a possibility that the substrate W is affected by different conditions, or there may be a risk when restarting a process even if the power failure situation is recovered later. In the inventive concept, whether the main transfer robot 3422 is in operation is first determined. Referring to FIG. 9, because the main transfer robot 3422 was in the process of transferring the substrate W, the main transfer robot 3422 having the substrate W thereon moves to chamber A that is a destination to which the substrate W is to be transferred. Referring to FIG. 10, the main transfer robot 3422 transfers the substrate W into chamber A after reaching chamber A that is a transfer destination. Thereafter, referring to FIG. 11, the main transfer robot 3422 moves to a safety position. The safety position will be described below.

Figure 12:
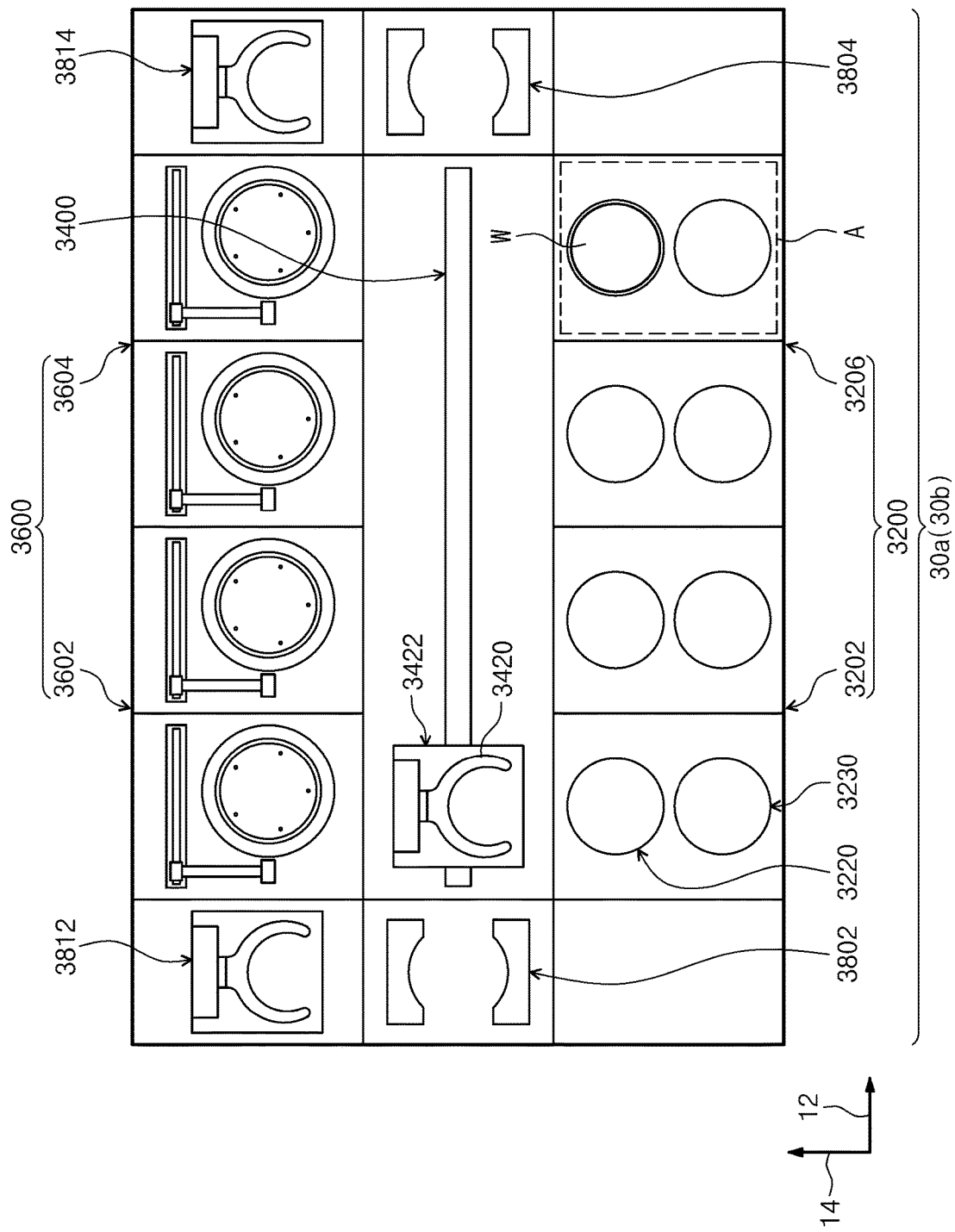

It is assumed that the settings in FIGS. 8 to 12 correspond to a process in which the main transfer robot 3422 extracts a new substrate from the buffer chamber 3800 and transfers the new substrate to the liquid treating chamber 3600 after the transfer of the substrate W into chamber A. In such a case, if a power failure does not occur, moving toward the front buffer 3802 to transfer the new substrate after the transfer of the substrate W into chamber A corresponds to the next step in which the main transfer robot 3422 moves. Accordingly, after completely transferring the substrate W into chamber A, the main transfer robot 3422 moves to and stands by in the position of the front buffer 3802 that is a standby position to which the next substrate is to be transferred. Referring to FIG. 12, it can be seen that the main transfer robot 3422 stands by in a safety position where the main transfer robot 3422 is able to transfer a substrate from the front buffer 3802.

Although the embodiment has been described above with reference to FIGS. 8 to 12, the robots may be controlled in various ways. That is, in the case where the robots are transferring substrates in the event of a power failure, the robots are controlled to complete transfer cycles, and after the completion of the transfer, the corresponding robots are moved to safety positions. The safety positions do not mean predetermined positions, but mean the closest standby positions in the case of performing the next step processing. For example, in the case of the main transfer robot 3422, the safety position may correspond to a transfer standby position of a substrate when the next processing is performed, and in the case of the index robot 2200, the safety position may correspond to a standby position where the next substrate is to be transferred. That is, the safety positions may be variously disposed based on stored information from a storage device of the emergency unit 70 that will be described below, and the safety positions may be variously disposed according to the progress of each process.

The emergency unit 70, when detecting a power failure, may determine whether the door of the cassette container 10 is open, and may perform control to close the door of the container 10 when the door is open. In the substrate treating apparatus, the treating module 30 is set to a situation and an environment in which a process is performed, and therefore management may be easy even though a power failure occurs. However, a substrate included in the container of the index module 20 is exposed to a room temperature and atmospheric pressure state and is therefore exposed in a defenseless state when a power failure occurs in the state in which the door is open. As a result, particles scattered from the surroundings may adhere to a substrate standing by in the cassette container 10 to cause contamination of the substrate W. However, in the case where the door is in a closed state, scattered particles may be prevented from adhering to substrates located inward of the door, and the substrates may be protected from other contaminant factors. Accordingly, in the case where the door of the cassette container 10 is open when a power failure occurs, the emergency unit 70 may perform control to close the door.

In addition, a control method of the chamber controller 62 that controls the heat treatment chamber 3200 and the liquid treating chamber 3600 will be described.

In the case of the liquid treating chamber 3600, when a power failure occurs, all processes are stopped. Therefore, in the case where a valve is open, there is no way to adjust the corresponding valve, and thus a substrate W is damaged. That is, to prevent a chemical solution from being continually dispensed in the event of a power failure during a liquid treating process, the emergency unit 70 operates the chamber controller 62 to stop the valve of the liquid treating chamber 3600 to enable a process to be performed again after the power failure is recovered, thereby preventing contamination of the substrate W.

In the case of the heat treatment chamber 3200, the cooling unit 3220 and the heating unit 3230 are provided as described above. When a substrate W is located on the heating unit 3230 in the event of a power failure, the substrate W receives heat from the corresponding heating unit 3230 even though the power failure occurs, and therefore there may be a problem in processing the corresponding substrate W. Hence, in the case where the substrate W is located on the heating unit 3230 in the heat treatment chamber 3200, the emergency unit 70 may perform control to move the substrate W to the cooling unit 3220 by using the transfer plate 3240 in the heat treatment chamber 3200. Thereafter, the substrate W is moved to the heating unit 3230 again and subjected to a process after the power failure is recovered, and thus the substrate W may be protected even in the event of the power failure.

Although it has been described in the embodiments and drawings of the inventive concept that the chamber controller 62 controls only the heat treatment chamber 3200 and the liquid treating chamber 3600, the control of the chamber controller 62 is not limited thereto. In the region of those skilled in the art, any control method capable of stopping a process being performed in a chamber or minimizing loss in the event of a power failure may be employed by the chamber controller 62 to prevent loss of a substrate.

The emergency unit 70 may further include a storage device that stores information about the position of a substrate in the substrate treating apparatus in the event of a power failure. The information stored by the storage device may be information about the positions and number of substrates W that are present in each module in the event of the power failure. Furthermore, the information stored by the storage device may be information about the position of the index robot 2200 or the main transfer robot 3422 in the event of the power failure. In addition, the information stored by the storage device may be information about the progress of a process on each substrate in the event of the power failure. The storage device may store in-device information in the event of the power failure, and therefore after-treatment may be more easily performed when the power failure is recovered. Specifically, the storage device, when the power failure is recovered, may compare the information stored in the event of the power failure and substrates in the recovered situation, thereby more efficiently performing after-treatment.

Hereinafter, a component for interrupting the main controller 60 will be described. A power failure may occur due to instantaneous current trip, or power may be off so that the overall current may be cut off. In the case of an instantaneous power failure, recovery has to be rapidly performed because it is efficient to make an operation as soon as possible when the instantaneous power failure is overcome. In contrast, in the case where the entire power is off, the facility cannot be used. Therefore, in the case of continuing to wait for recovery of the power failure, power may be wasted in the situation in which the power failure is recovered late. Accordingly, the emergency unit 70 may set predetermined standby time, maintain the power of the main controller 60, and interrupt the power of the main controller 60 when the power failure continues even after the predetermined standby time passes, thereby preventing additional power waste. In the case where the power failure situation is released before the standby time passes, the power of the main controller 60 is not interrupted, and the main controller 60 may stand by after completing an alarm state. Or, the progress of a process may be started again, and the entire process may be controlled. The predetermined standby time may be set to five minutes. However, the corresponding standby time is not a fixed value and may be time suitable for determining whether the power failure continues.

Figure 13:
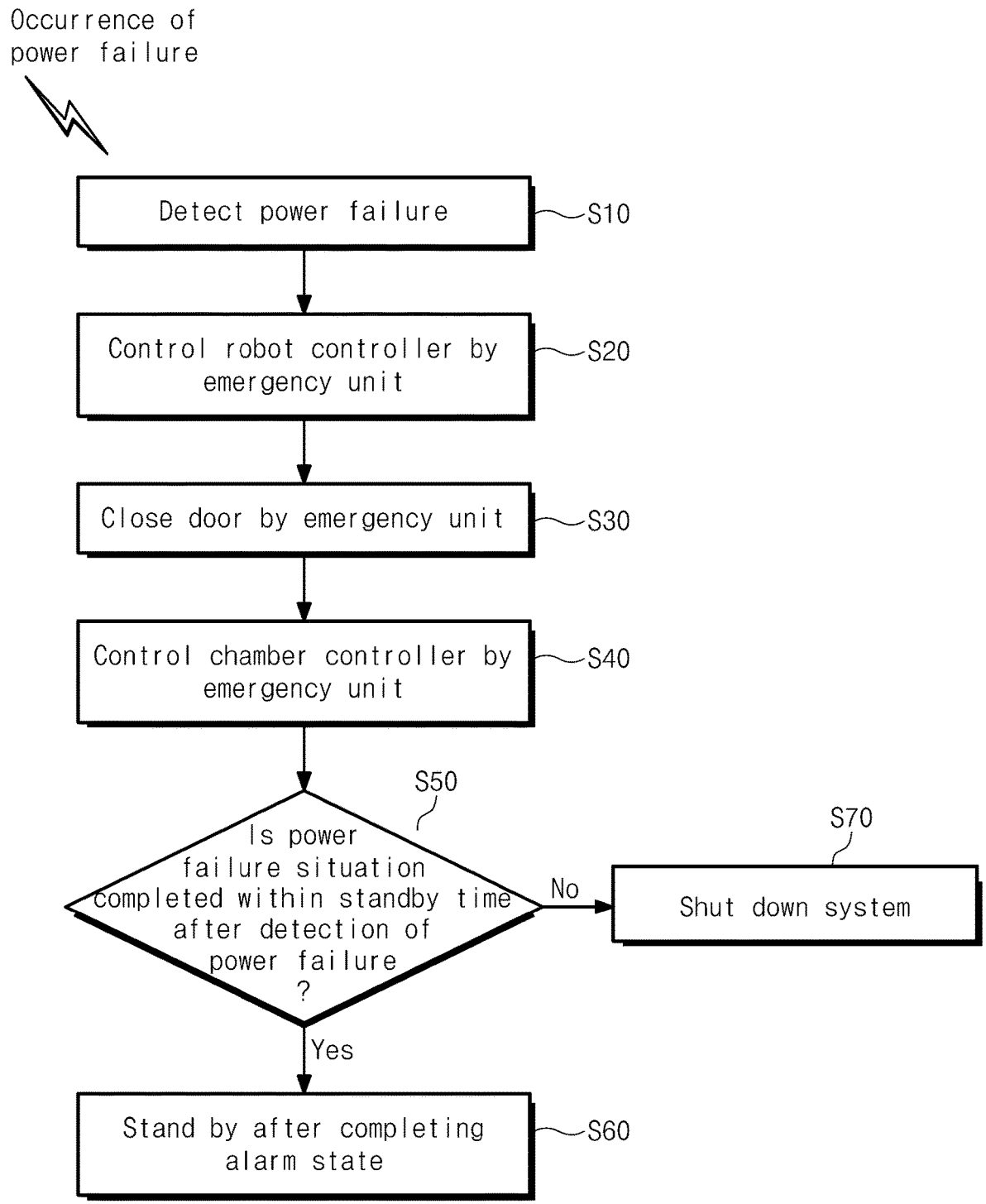
FIGS. 13 and 14 are flowcharts illustrating a substrate treating method in the event of a power failure according to the inventive concept.
Figure 14:
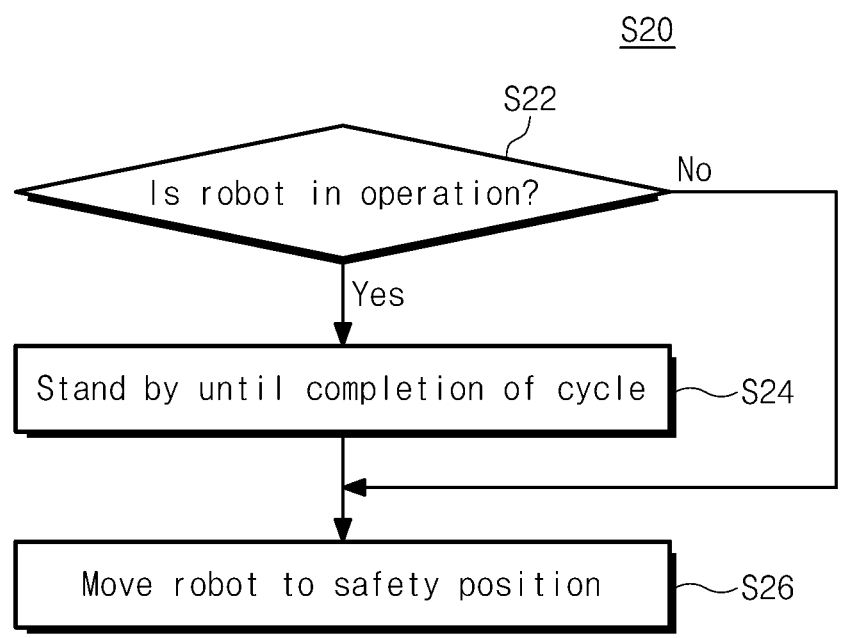

Hereinafter, a substrate treating method of the inventive concept will be described with reference to FIGS. 13 and 14.

In the substrate treating method of the inventive concept, when a power failure occurs, the emergency unit 70 detects whether the power failure occurs (S10). When the power failure is detected, the emergency unit 70 controls the robot controller 61 (S20). Specifically, in step S20, the emergency unit 70 determines whether the index robot 2200 or the main transfer robot 3422 is in operation, and when it is determined that the index robot 2200 or the main transfer robot 3422 is in operation, the emergency unit 70 performs control such that a predetermined transfer cycle of the corresponding robot is completed. When the corresponding transfer cycle is completed, the emergency unit 70 performs control to move the index robot 2200 or the main transfer robot 3422 to a safety position. The safety position is the same as that described above. Even when the index robot 2200 or the main transfer robot 3422 is not in operation, the emergency unit 70 may identify the next process information and the safety position and may perform control to move the robot 2200 or 3422 to the safety position. Thereafter, in the case where the door of the container 10 is open, the emergency unit 70 may close the door (S30). Furthermore, the emergency unit 70 may control the chamber controller 62 to protect substrates being processed in processing chambers to the maximum (S40). The emergency unit 70 may set predetermined standby time from when the power failure is detected (S50) and may shut down the entire main controller 60 when the power failure state is maintained even after the standby time passes, thereby preventing additional damage (S70). In the case where the power failure state is released before the standby time passes, the emergency unit 70 may perform a process again or may be in a standby state until an additional alarm signal is received (S60).

According to the embodiments, the substrate treating apparatus and method may perform after-treatment when an emergency situation occurs, thereby safely protecting a substrate and facilities.

In addition, the substrate treating apparatus and method may perform after-treatment when an emergency situation occurs, thereby easily performing after-treatment when the emergency situation is recovered.

Effects of the inventive concept are not limited to the above-described effects. Any other effects not mentioned herein may be clearly understood from this specification and the accompanying drawings by those skilled in the art to which the inventive concept pertains.

Although the embodiments of the inventive concept have been described above, it should be understood that the embodiments are provided to help with comprehension of the inventive concept and are not intended to limit the scope of the inventive concept and that various modifications and equivalent embodiments can be made without departing from the spirit and scope of the inventive concept. The drawings provided in the inventive concept are only drawings of the optimal embodiments of the inventive concept.

The scope of the inventive concept should be determined by the technical idea of the claims, and it should be understood that the scope of the inventive concept is not limited to the literal description of the claims, but actually extends to the category of equivalents of technical value.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A method for treating a substrate using a substrate treating apparatus that includes a treating module configured to treat the substrate and an index module disposed adjacent to the treating module and configured to transfer the substrate between a container in which the substrate is received and the treating module, wherein a plurality of process chambers configured to treat the substrate and a main transfer robot configured to transfer the substrate between the plurality of process chambers are provided in the treating module, and a container mounting table on which the container is placed and an index robot configured to transfer the substrate between the container and the treating module are provided in the index module, the method comprising:

sensing that a power failure occurs in the substrate treating apparatus; and executing a power failure after-treatment operation and thereafter stopping an operation of the substrate treating apparatus, wherein the power failure after-treatment operation includes:

an operation of determining whether a door of the container is open, and, if yes, closing the door of the container placed on the container mounting table, when the door is open in the event of the power failure;

an operation of setting a predetermined standby time; and an operation of maintaining power of a controller during standby time in the event of the power failure and interrupting the power of the controller when the power failure is maintained until the standby time passes.

2. The method of claim 1, wherein when the main transfer robot or the index robot is transferring the substrate, the power failure after-treatment operation includes an operation of continually maintaining the transfer of the main transfer robot or the index robot until a predetermined transfer cycle is completed.

3. The method of claim 2, wherein the main transfer robot or the index robot is moved to a safety position after the transfer is completed.

4. The method of claim 1, wherein the power failure after-treatment operation further includes:

an operation of shutting down the power of the controller in the event that a state of the power failure is maintained even after the standby time passes.

5. An apparatus for treating a substrate, the apparatus comprising:

a treating module having a plurality of process chambers and a main transfer robot;

a cassette container in which the substrate to be subjected to a process is stored;

an index module configured to transfer the substrate between the cassette container and the treating module and including an index robot;

a main controller configured to perform overall control of the process;

a robot controller configured to control the index robot configured to transfer the substrate between the cassette container and the treating module and the main transfer robot configured to transfer the substrate between the plurality of process chambers of the treating module;

a chamber controller configured to control the process chambers in the treating module; and an emergency unit in electrical communication with the robot controller and the chamber controller, and configured to sense that a power failure occurs and control an after-treatment operation to be performed, wherein the after-treatment operation includes:

an operation of determining whether a door of the container is open, and, if yes, closing the door of the container placed on the container mounting table, when the door is open in the event of the power failure;

an operation of setting a predetermined standby time; and an operation of maintaining power of a controller during standby time in the event of the power failure and interrupting the power of the controller when the power failure is maintained until the standby time passes.

6. The apparatus of claim 5, wherein the emergency unit controls the robot controller to complete a transfer cycle of the index robot or the main transfer robot.

7. The apparatus of claim 6, wherein the emergency unit controls the robot controller to move the index robot or the main transfer robot to a safety position after the transfer cycle is completed.

8. The apparatus of claim 5, wherein the emergency unit controls the chamber controller to close a valve in a liquid treating chamber of the treating module.

9. The apparatus of claim 5, wherein the emergency unit controls the chamber controller to move the substrate on a heating unit in a heat treatment chamber of the treating module to a cooling unit.

10. The apparatus of claim 5, wherein the emergency unit further includes a storage device configured to store information about a position of the substrate in the apparatus at the time that the power failure occurs.

11. The apparatus of claim 5, wherein the emergency unit performs control to shut down the power of the main controller in the event that a state of the power failure is maintained even after the standby time passes.

* * * * *